United States Patent [19]

Peyraud et al.

[11] 4,166,563

[45] Sep. 4, 1979

[54] TRANSFER MACHINE FOR SEALING ELECTRONIC OR LIKE COMPONENTS UNDER VACUUM

[75] Inventors: Dominique Peyraud; Martial Voumard, both of Bienne, Switzerland

[73] Assignee: Societe Suisse pour l'Industrie Horlogere Management Services, S.A., Switzerland

[21] Appl. No.: 837,232

[22] Filed: Sep. 27, 1977

[51] Int. Cl.² .................. B23K 3/00; C23C 13/08; H01L 41/22

[52] U.S. Cl. .................. 228/47; 228/221; 29/722; 198/339; 198/619; 316/19

[58] Field of Search .......... 228/47, 221; 198/339, 198/619, 690; 266/250; 29/722, 729; 316/31

[56] References Cited

U.S. PATENT DOCUMENTS

| | | | |
|---|---|---|---|
| 3,202,406 | 8/1965 | Tack | 198/619 X |
| 3,317,106 | 5/1967 | Dix | 228/44.1 A |
| 3,717,119 | 2/1973 | Boys et al. | 198/339 X |
| 3,914,836 | 10/1975 | Hafner et al. | 228/221 X |
| 4,030,622 | 6/1977 | Brooks et al. | 198/339 X |

Primary Examiner—Carl E. Hall
Assistant Examiner—Kenneth J. Ramsey
Attorney, Agent, or Firm—Griffin, Branigan and Butler

[57] ABSTRACT

An apparatus is provided comprising three elongated vacuum chambers arranged in line one after another whereby a component carrying means may be transferred successively from one chamber to another. Of these three chambers the first and third comprise air locks and the intermediate chamber contains heat sealing means whereby components undergoing sealing may be soldered under vacuum. By providing a permanent magnet on each end of the component carrying means this may be shifted between vacuum chambers by external application of a magnet. The overall length of the apparatus is reduced since only three chambers are required and the intermediate chamber may be made shorter than would be the case where no such arrangement is provided.

9 Claims, 6 Drawing Figures

TRANSFER MACHINE FOR SEALING ELECTRONIC OR LIKE COMPONENTS UNDER VACUUM

BACKGROUND OF THE INVENTION

The problem arises in the mass production of certain electronic components, for example quartz crystal resonators, which are required in view of their nature to be maintained under vacuum and thus must be placed in supporting containers in such a way to be competely sealed. This sealing must be absolute in nature and must have a life of at least several years. In the case of quartz resonators for instance, even the smallest leaks will bring about an increase in the series resistance of the resonator which finally will no longer oscillate.

In mass production of such components there are many problems to be resolved and in effect the mere fact that the soldering itself must respond to severe criteria implies that the components involved must be brought to the soldering centre by automatic means. It has already been proposed to provide an arrangement including air locks in which a component carrier would be transferred from an air lock into a working chamber and thereafter would exit through a second air lock. The problem here is one of mass production in soldering several hundreds of these components in succession. A component carrier then may take the form of an elongated element or bar provided with cells for holding and retaining the components undergoing sealing, each such component being stepped under a soldering head. In order to maintain such a bar under the necessary vacuum, the working chamber is required to be unusually long. It is in an effort to reduce the dimensions of the apparatus as well as to speed up the entire procedure that the present transfer apparatus has been devised. Herein a positive advantage is secured inasmuch as the working chamber need no longer be twice the length of the component carrying bar. In prior art arrangements in which air locks were not generally applied the working chamber had to be at least twice the length of the component carrying bar and thus at each occasion when the apparatus was loaded a substantial waiting time would accrue in order to achieve the vacuum under which the soldering would then be carried out. In the present apparatus two air locks are provided as well as the working chamber, each of the three chambers being substantially equal to the length of the component carrying bar. Gate type valves are provided between air locks and the working chamber and as well valves are provided at the outer end of the two air locks. Thus, it becomes possible to maintain at all times a partial vacuum within the system and in this way the entire procedure is accelerated. For example, it is always possible to maintain a vacuum of $10^{-2}$ Torr. This is owing to the system of valves and to the two air locks. Transport from an entry air lock into the working chamber and thence into the exit air lock is effected by means of a magnet on each end of the component carrying bar and through the use of external magnets which may operate through the walls of the air locks, these being formed of a material permeable to magnetic lines of force.

SUMMARY OF THE INVENTION

The invention thus comprises a transfer machine for sealing electronic or like components under vacuum comprising a plurality of interconnected vacuum chambers in a linear arrangement, component carrying means adapted to the form and dimensions of the vacuum chanbers so as to be capable of being transported through said chambers successively, valve means which when closed isolate the chambers from one another or from the surrounding atmosphere, a sealing instrumentality in at least one chamber arranged to effect sealing of the components in succession and transport means actuable from the exterior so as to transfer the carrying means into and out of a chamber provided with sealing means without breaking the vacuum.

DETAILED DESCRIPTION OF THE INVENTION

Figure 1:
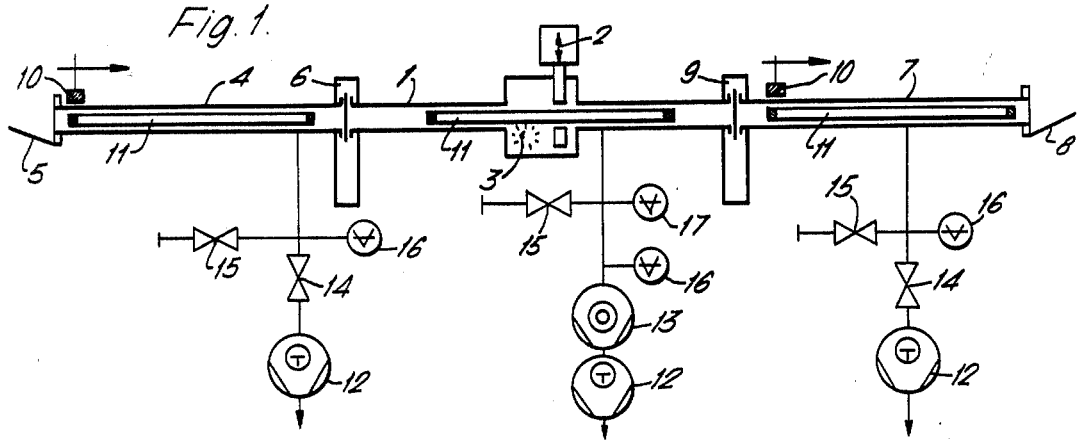
FIG. 1 is a schematic diagram showing the arrangement of the overall system.

In the preferred version the machine comprises three vacuum chambers of elongated form which are connected in a linear arrangement as shown in FIG. 1. Thus, working chamber 1 is in the centre and is provided with a sealing head 2 and a stepping mechanism 3 which may for example comprise a pinion which engages with a rack mounted on a component carrying bar 11. The first vacuum chamber 4 comprises an entry air lock and is coupled to the working chamber 1 through a gate-type valve 6. At its entry end it is further provided with a valve 5. The third vacuum chamber 7 constitutes an exit air lock and is likewise coupled to the working chamber 1 by means of a gate valve 9. As in the case of the entry air lock it is also provided with a valve 8 which will be closed when under vacuum. Each of the separate chambers is provided with its own separate pump to obtain the vacuum therein. Thus, vacuum pump 12 is connected over valve 14 with the entry air lock 4 and a similar pump is likewise connected with the exit air lock 7. The control lines in both cases are respectively provided with release valves 15 whereby air may be admitted, and pressure gauges 16. The working chamber 1 is likewise provided with vacuum pumping means and in this case such vacuum pump may comprise a primary vacuum pump 12 as in the preceding cases as well as a turbo-molecular type of vacuum pump 13 whereby a higher vacuum may be obtained within the working chamber. As in the case of the air locks a system of release valves and gauges is provides as shown at 15, 16 and 17.

The component carrying bar 11 in a typical version may have therewithin 200 cells each of which is adapted to provide space for one component to be sealed by soldering for example. Each end of the bar 11 is provided with a permanent magnet which may be oppositely poled. The material from which the three vacuum chambers are fashioned may be any suitable material capable of sustaining a vacuum and at the same time capable of being traversed by magnetic lines of force. External to the arrangements just described there may be provided a magnetic means 10 which could in a manually operated version comprise a simple hand held permanent magnet or in a more automated version might comprise an electromagnet controlled by electronic means.

An electronic control system for the apparatus as shown may provide sequential controls whereby following introduction of a component carrying bar and closing of the entry valve 5 the entry air lock is placed under vacuum. Thereafter, once the desired degree of vacuum which may, for instance, be $10^{-2}$ Torr has been achieved it is then possible to open the gate valve 6 interconnecting the entry air lock and the working chamber 1. Herein it is now necessary to obtain the working vacuum which should be approximately $10^{-4}$ Torr. As soon as this has been achieved then the component carrying bar may be transferred from the entry air lock into the working chamber through application of the magnetic means at the exterior. When transfer has been effected the rack mechanism provided on the transport bar will engage with the pinion 3 whereby the electronic control may then provide signals to effect stepping of each cell past the head 2 heat being applied to each component in succession to effect soldering thereof. As soon as the component carrying bar is entirely within the working chamber 1 then the gate valve 6 may be closed and the entry air lock subsequently reopened following air admission by means of the release valve 15 whereby the entry air lock is now prepared to receive a new bar carrying a further supply of components to be soldered. The exit vane or gate valve 9 may be opened once the component carrying bar has progressed a certain distance and thereafter the bar as soon as all components have been sealed may be entirely shifted into the exit air lock 7, again through application of the external magnet means. Thereafter, the exit gate valve 9 may be closed and ambient pressure then restored to exit air lock 7 by means of release valve 15. Exit valve 8 may now be opened and the bar 11 removed, again with the aid of magnetic means 10.

Figure 2:
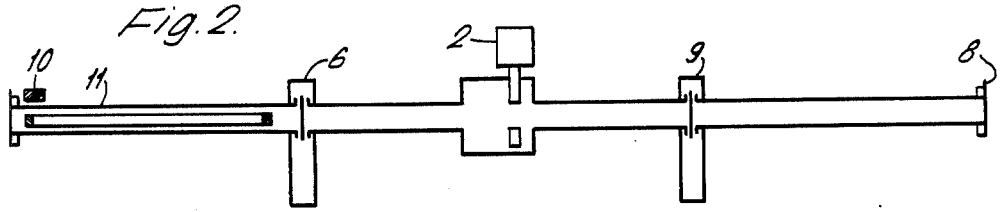
FIGS. 2,3,4,5 and 6 show successive partial views of a component carrying bar being transported through the machine.

FIGS. 2, 3, 4, 5 and 6 show in succession the steps which may be followed in a practical embodiment of the invention. In the initial state the apparatus is ready to operate with the entry air lock opened, the working chamber under a vacuum of $10^{-4}$ Torr and the exit air lock under a vacuum of $10^{-2}$ Torr with the exit and entry gate valves 6 and 9 respectively closed. The first step then is to introduce the component carrying bar 11 into the entry air lock 4 as shown in FIG. 1. In FIG. 2 the valve 5 is then closed and the entry air lock is exhausted to a vacuum of $10^{-2}$ Torr by means of the primary vacuum pump 12.

Figure 3:
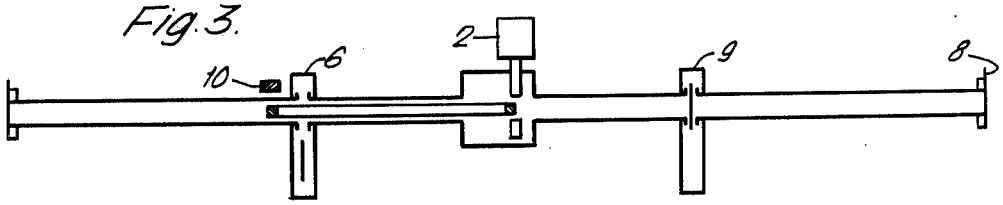
Figure 4:
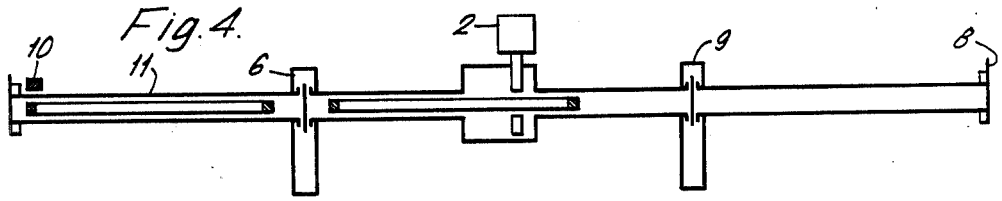
Figure 5:
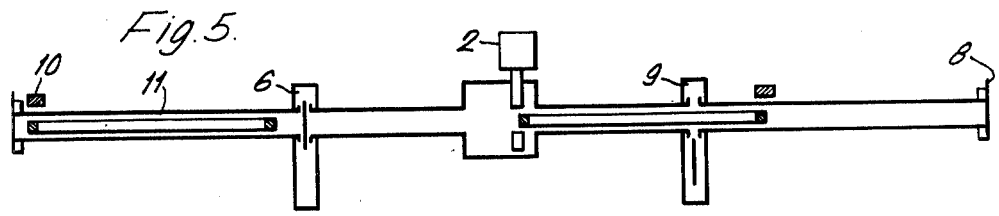
Figure 6:
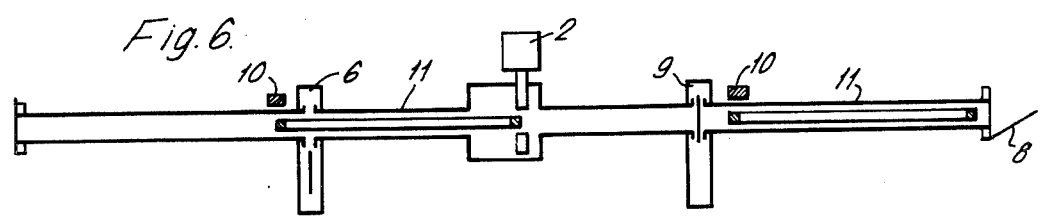

When this vacuum has been achieved, the gate valve 6 is opened as shown in FIG. 3 and the component carrying bar 11 is then shifted into the working chamber 1 by means of the magnetic coupling to the point where the stepping means 3 has been properly engaged. When the component carrying bar has stepped a certain distance the exit valve 9 may be opened and as soon as a vacuum of $10^{-4}$ Torr has been achieved within the working chamber then sealing may continue and the components each in their individual retaining cell are passed successively under the head 2 by means of the stepping arrangement 3 as shown. It is noted, moreover, that as soon as the component carrying bar is entirely past the entry gate valve 6 said gate valve is closed and thereafter the entry air lock 4 may be reopened as soon as the vacuum has been relieved through operation of the release valve 15. At this point a further component carrying bar 11 may be placed within the entry air lock 4.

In the meantime soldering will be continued and eventually the component carrying bar will be partially projected into the exit air lock 7 which is at this time presently also under vacuum. As soon as sealing has been completed on the last component the soldering cycle will be stopped and through the magnetic means the entire component carrying bar may be shifted into the exit air lock 7 whereupon the exit gate valve 9 is once again closed off. As soon as the vacuum has been relieved in the exit air lock 7 then the valve 8 may be opened and the component carrying bar removed from the system. While this has been taking place a further component carrying bar has been introduced into the working chamber 1 via the entry air lock 4.

It will be observed throughout that at no time has it been necessary to lose the entire vacuum within the working chamber 1. At the same time it is possible through the means herein adopted to reduce considerably the length of this working chamber 1. It will be obvious, however, that without the air lock and magnetic arrangements provided it would be necessary to have a working chamber which would be at least double the length of the component carrying bar and that at each cycle it would be necessary to lose the entire vacuum within the working chamber and restore the vacuum prior to commencement of a new soldering cycle. The arrangement as presently shown overcomes these difficulties entirely and thus saves both time and space.

What we claim is:

1. Transfer machine for sealing electronic or like components under vacuum comprising at least three serially interconnected elongated vacuum chambers in a linear arrangement, an elongated component carrying means for carrying said components through said transfer machine, said component carrying means being adapted to the form and dimensions of the vacuum chambers so as to be capable of being transported through said chambers successively, at least four valve means, a first thereof being positioned at an entrance opening into said first vacuum chamber, a second being positioned between said first and second vacuum chambers, a third being positioned between said second and third vacuum chambers and a fourth being positioned at an exit opening of said third vacuum chamber, which when closed isolate the vacuum chambers from one another and from the surrounding atmosphere, a sealing instrumentality in said second vacuum chamber arranged to effect sealing of the components in succession, and transport means actuable from the exterior so as to transfer the carrying means into and out said second vacuum chamber provided with sealing means without breaking the vacuum, the length of said carrying means being less than the distances between said successive valve means but the distance between said sealing instrumentality and at least one of said second and third valve means being less than the length of said carrying means.

2. Transfer machine as set forth in claim 1 wherein said at least three vacuum chambers are each provided with vacuum pumping means.

3. Transfer machine as set forth in claim 2 wherein the second vacuum chamber is provided with linear stepping means whereby the component carrying means may be moved past the sealing instrumentality in a succession of steps.

4. Transfer machine as in claim 1 wherein the distance between said sealing instrumentality and each of said second and third valve means is less than the length of said carrying means.

5. Transfer machine as set forth in claim 1 wherein the component carrying means is provided with a plurality of cells, each cell being arranged to receive a component intended for sealing under vacuum.

6. Transfer machine as set forth in claim 5 wherein each end of the component carrying means is provided with magnetic means.

7. Transfer machine as set forth in claim 6 wherein the vacuum chambers are formed of material capable of being traversed by magnetic lines of force whereby the component carrying means may be shifted successively through the vacuum chambers by a magnet maintained entirely external to said vacuum chambers.

8. Transfer machine as set forth in claim 1 wherein the components to be sealed under vacuum comprise housing and support means for piezo-electric crystals.

9. Transfer machine as set forth in claim 1 wherein the sealing instrumentality is arranged to apply heat so as to effect soldering of the components undergoing sealing.

* * * * *